United States Patent
Dufilie

[11] Patent Number: 5,550,793
[45] Date of Patent: Aug. 27, 1996

[54] UNIDIRECTIONAL WAVE TRANSDUCER

[75] Inventor: Pierre Dufilie, Vernon, Conn.

[73] Assignee: Thomson-CSF, Paris, France

[21] Appl. No.: 397,053

[22] Filed: Apr. 26, 1995

[51] Int. Cl.$^6$ .................................................. H04R 17/00
[52] U.S. Cl. ................ 367/164; 310/313 R; 310/313 B; 310/313 D; 333/150; 333/154; 333/193; 333/195
[58] Field of Search ...................................... 367/164, 140; 310/313 R, 313 B, 313 D; 333/150, 154, 193, 195

[56] References Cited

U.S. PATENT DOCUMENTS

| 4,087,714 | 5/1978 | LaRosa et al. | 310/313 |
| 4,775,846 | 10/1988 | Shiba et al. | 333/194 |
| 5,313,177 | 5/1994 | Hickernell et al. | 333/193 |
| 5,438,306 | 8/1995 | Yamanouchi et al. | 333/195 |

Primary Examiner—J. Woodrow Eldred
Attorney, Agent, or Firm—Oblon, Spivak, McClelland, Maier, Neustadt, P.C.

[57] ABSTRACT

The invention concerns unidirectional ground-wave transducers using an alternating series of emitter cells (E) and reflector cells (R).

The invention consists in using, in the emitter cells (E), fingers having a width of $\lambda/3$ spaced apart by a distance of $2\lambda/3$; and, in the reflector cells (R), fingers having a width of $\lambda/4$ spaced apart by a distance of $\lambda/2$.

Using identical engraving precision, the invention makes it possible to increase by 50% the frequency at which the unidirectional transducer thus produced can be used.

8 Claims, 4 Drawing Sheets

UNIDIRECTIONAL WAVE TRANSDUCER

The present invention concerns unidirectional ground wave transducers allowing propagation along the surface of a substrate of a ground wave, in such a way that the main part of the signal is emitted through one end of this transducer, and that any signal emitted from the other end of the transducer is of a very low level in comparison with the main signal.

The current state of the art encompasses various methods for producing transducers of this kind, for example by using floating electrodes that are engraved with an accuracy of more than $\lambda/8$, $\lambda$ being the wavelength at the midband frequency of the frequency band within which the transducer is used, or metal or dielectric layers superposed on the electrode metal plating. These methods are costly, and difficult to implement.

To solve these problems, the Applicant, in French Patent Application No. 89 13747, filed Oct. 20, 1989 and published Apr. 26, 1991 under number 2,653,632, proposed making a alternating series of emitter and reflector cells, in which the emitter cells comprise fingers having a width substantially equal to $\lambda/6$ and spaced apart by a distance equal to $\lambda/3$; the reflector cells have fingers approximately $\lambda/4$ in width and are spaced apart by $\lambda/2$.

While the advance represented by this structure is unquestioned, the precision entailed by engraving so as to obtain a spacing of $\lambda/6$ must therefore be great, and, in consequence, not easily achieved.

To solve this difficulty, the invention relates to a transducer according to claim 1.

Other features and advantages of the invention will clearly emerge from the following description provided as non-limiting examples with reference to the attached drawings, in which:

FIG. 1 illustrates an example showing the overall structure of the electrodes in an operating acoustic reflection transducer, similar to those placed on the surface of a piezoelectric substrate (not shown in the figure).

These electrodes are illustrated by rectangles containing excitation means (not shown), which normally exist as interdigitated combs. One of these combs is grounded and the other is connected to an electrical connection S. When an electric signal is applied at S, an acoustic wave is generated at each of the left (G) and right (D) acoustic ports formed by the ends of the transducer. This unit is, moreover, reversible, and the acoustic waves propagated on the substrate surface may enter through these ports and energize the transducer so that it will supply an electric signal to the connection S.

The electrodes are combined as emitter cells $E_1$ to $E_3$ and as reflector cells $R_1$ to $R_4$ aligned in alternating fashion along the axis of propagation of the acoustic waves. Only the emitter cells connected to the electrical connection S energize the acoustic waves on the substrate surface, while the reflector cells modify the acoustic propagation characteristics along this axis.

As in the aforementioned French patent application, the invention is intended to produce, based on the structure of the emitter and reflector cells and on their respective arrangement, a substantially nil electro-acoustic transfer between the electric input port S and one of the two left or right acoustic ports G or D. This zero transfer produces a single-phase unidirectional transducer.

Figure 1:
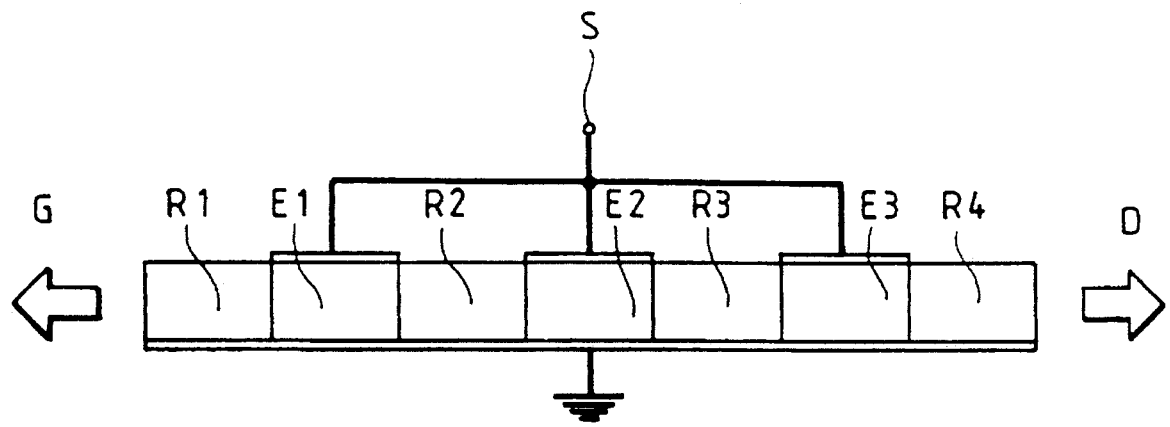
FIG. 1 is a top view of the conventional skeleton structure of a unidirectional transducer.
Figure 2:
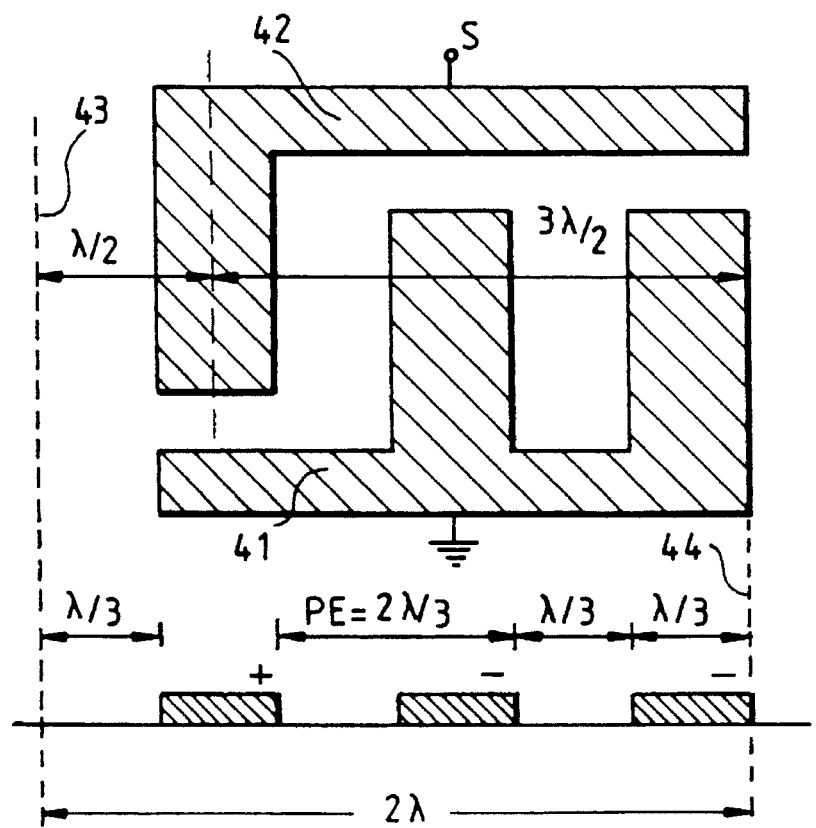
FIG. 2 is a top view of an emitter cell according to the invention.

FIG. 2 illustrates two views of an emitter cell E, a top view in the upper part of the figure and a cross-sectional view corresponding to the top view, in the lower part thereof. The two electrodes form interdigitated combs. The grounded electrode 41 incorporates two fingers, and the electrode 42 connected to the terminal S comprises only one. These fingers are spaced apart by $P_E=2\lambda/3$, $\lambda$ being the wavelength at the operating midband frequency of the device. The nominal width of the fingers is $\lambda/3$, but this value is not imperative. The succession of fingers is such that the single finger of the electrode 42 is followed by the two fingers of the electrode 41, going from left to right. To properly delimit the emitter cell with reference to its position in FIG. 1, the conventional boundaries, both left 43 and right 44, will be specified. The left boundary 43 is located $\lambda/2$ to the left of the center of the single finger of the electrode 42, and the right boundary 44, $3\lambda/2$ to the right of this center. The total length of the cell between its left and right boundaries is, therefore, $2\lambda$.

Because of the type of connection to the electric signal source allowing the cell to be energized, the electrode 41, which is grounded, is a cold electrode and the electrode 42, a hot electrode, as understood radioelectrically by the use of the symbols − and +. It may also be said that the + electrodes are "active," and the − electrodes "inactive." Under these conditions, the emission center of the acoustic waves is located in the center of the single finger belonging to the electrode 42. By virtue of the specification of the left and right boundaries, the acoustic waves emitted by the single finger of the electrode 42 exhibit a phase difference of 360° at these two boundaries, and are thus "in phase."

The cell illustrated in FIG. 2 is the simplest cell that can be produced according to the invention. It thus represents merely one very specific, non-limiting example of an emitter cell. It is possible, especially to increase the emission efficacy of the acoustic waves, to enlarge the cell by duplicating it exactly using a $2\lambda$ translational shift. The cells thus produced by duplicating the configuration N times will comprise N fingers on the electrode 42 and 2N fingers on the electrode 41. These fingers will occur in succession according to the sequence specified in FIG. 2. All of these cells will possess the same basic characteristic as does the elementary cell in FIG. 2: that is, the acoustic wave will be in phase at the two boundaries, left and right, of the cell. Moreover, within a multi-component cell of this type, a number of fingers belonging to the electrode 42 could be eliminated, for example by connecting them to the electrode 41, in order to weight conventionally the emitted signal so as to perform, for example, specific filtering functions.

Figure 3:
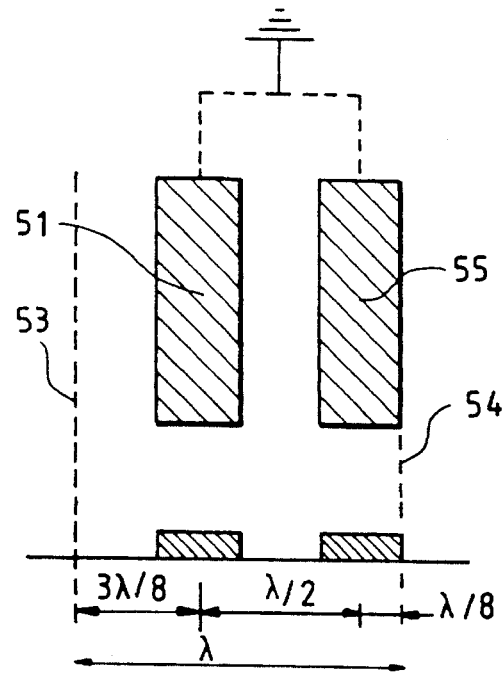
FIG. 3 is a top view of a reflector cell used in the invention.

FIG. 3 illustrates, using the same conventions as in FIG. 2, a reflector cell comprising two finger-shaped electrodes 51 and 55. These electrodes are spaced apart by $P_R=\lambda/2$. Their nominal width is $\lambda/4$, but this width is not imperative. They may be either isolated or grouped together and grounded, that is, in this last case, in a short-circuit. As in the case of the transmitter cell, a left boundary 53 located at $3\lambda/8$ to the left of the center of the electrode 51 and a right boundary 54 located $\lambda/8$ to the right of the center of the electrode 55 are specified. Each of these electrodes acts as an elementary reflector, and it is known that the reflection coefficient of each of these reflectors is purely imaginary, if the axis of symmetry of this reflector is taken as the phase reference for incident and reflected waves. In other words, reflection exhibits a phase shift of + or −90°. The determination of + or − depends, conventionally, on the physical properties of the materials and of the substrate, in conjunction with the fact that the fingers are isolated or combined in a short-circuit. In the most frequently-occurring case, the sign + indicates that the fingers are short-circuited, and the signal −, that the fingers are isolated. In the remainder of the description, the sign + will be considered, but the invention is also applicable when the sign is −.

Under these conditions and taking as reference point the left boundary 53, the phase difference at this left boundary between the incident wave and the wave reflected on the first reflector 51 is 360°, or 0°, since a 90° phase shift occurs as a result of reflection and a 270° shift results from the back-and-forth movement over a distance of $3\lambda/8$ between the left boundary and the center of the reflector. Because the distance between the reflectors is $\lambda/2$, the same calculation can be made with respect to the reflector electrode 55. The wave reflected on the latter will be in phase with the wave reflected on the electrode 51, and, therefore, in phase with the incident wave at the left boundary 53. Because the reflection coefficient of a single electrode is low and, accordingly, since a large portion of the incident wave coming from the left continues to be propagated toward the right after travelling across the site of an electrode, the reflection coefficient of two electrodes, as in the single reflector cell illustrated in the figure, will be two times that of an isolated electrode. Similarly, in the case of a more extended reflector cell comprising, for example, m reflector electrodes, the total reflection coefficient of this cell will be approximately m times the reflection coefficient of a single electrode.

When the acoustic waves come from the right, they are also reflected on the reflectors and, when the right boundary 54 is taken as the phase source, the length of the back-and-forth movement on the first electrode 55 equals $\lambda/4$, since the center of reflection, i.e., the middle of this electrode, is separated by a distance of $\lambda/8$ from the right boundary 54. Taking into account the 90° phase shift resulting from reflection, the phase difference between the incident wave and the reflected wave at the right boundary 54 is 180°. The same situation is true to within 360° as regards reflection on the electrode 51 in FIG. 3 and on any other additional electrode, when a more extended reflector cell is chosen. The sum of the reflected waves on each of these electrodes produces the entire reflected wave in the same way as that described above.

In short, taking the left boundary 53 as the phase reference point, the reflection coefficient of an incident wave coming from the left has a phase of 0°. Taking the right boundary 54 as the phase reference point, the reflection coefficient for an incident wave coming from the right has a phase of 180°.

Figure 4:
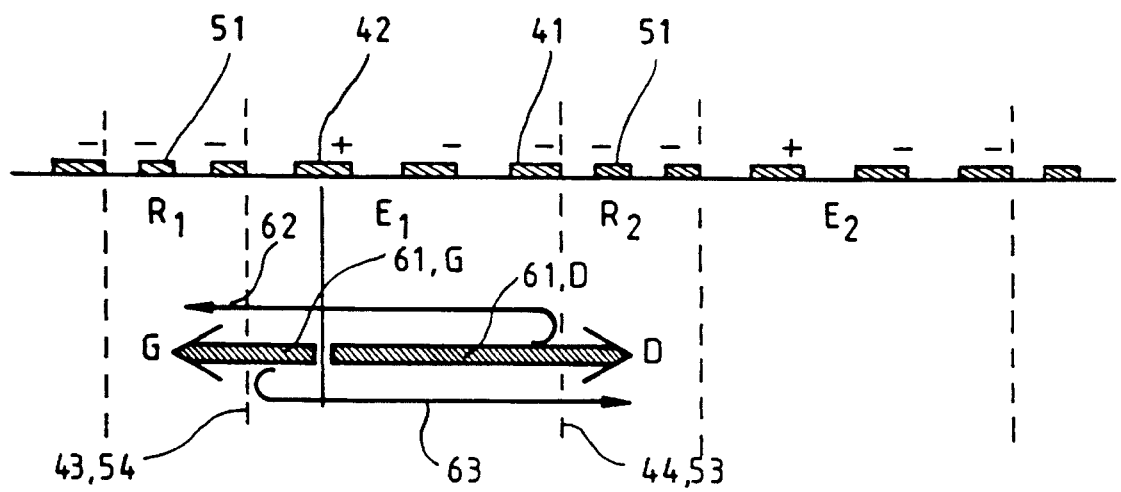
FIG. 4 is a cross-sectional view of a portion of the transducer according to the invention.

FIG. 4 is a cross-sectional view of a cell $E_1$ of the type described above, bounded by two reflector cells $R_1$ and $R_2$ of the type described above. This figure also illustrates the cross-section of a cell $E_2$ and the beginning of two other reflector cells on the right and left, in order to show clearly that $E_1$, $R_1$, and $R_2$ belong to a unit in relation to which the description of operation is identical to the following description for $E_1$, $R_1$, and $R_2$.

These cells are arranged in such a way that the left boundary of $E_1$ corresponds to the right boundary of $R_1$, and the right boundary of $E_1$, to the left boundary of $R_2$. These conventional boundaries were delimited precisely for this reason, i.e., to make it possible to more easily describe the respective positions of the emitter and the reflector cells.

Accordingly, there is a shared boundary 43–54 between $R_1$ and $E_1$ and a shared boundary 44–53 between $E_1$ and $R_2$.

The acoustic waves 61,G and 61,D emitted by $E_1$ from the center of the electrode 42 are emitted symmetrically from both sides of this electrode toward the boundaries of $E_1$.

With respect to the cell $R_2$, the wave 61,D is incident from the left. It is, therefore, partially reflected with zero phase shift at the boundary 44, 53 in the form of a wave 62.

After propagation over a length of $2\lambda$, this wave 62 reaches the boundary 43, 54. Since, as indicated above, the phase of the waves 61,G at the boundary 43, 45 and 61,D at the boundary 43, 54 are the same, the waves 62 and 61,G have the same phase.

on the other hand, the incident wave 61,G coming from the right at the common boundary 43, 54 is reflected there in the form of a wave 63 incorporating a phase shift of 180°, as was indicated above. Accordingly, this wave is in opposition of phase at the other shared boundary 44, 53 in relation to the wave 61,D. These waves 63 and 61,D thus produce destructive interference, thereby attenuating the residual wave being propagated toward the right side of the figure. On the whole, the elementary unit formed by an emitter cell $E_1$ bounded by two reflector cells $R_1$ and $R_2$ acts as a transducer, which emits toward the left an acoustic wave whose amplitude is greater than that of the acoustic wave emitted toward the right. Repetition of this elementary unit a certain number of times produces a transducer which is substantially unidirectional in its entirety. Indeed, because the reflector cells $R_1$ to $R_N$ are separated from each other by a whole number of half-wavelengths, they generate reflected waves all of which are in phase, thereby intensifying the property described above. The emitter and reflector cells do not, moreover, all have to be identical; it suffices that the phase conditions at the boundaries be the same as those specified in the basic cells described above.

It will also be noted that, if the reflection coefficient inherent in each elementary reflector belonging to the reflector cells is −90°, the operation of the unit is reversed; and that a left-to-right instead of a right-to-left unidirectional transducer is obtained.

It is known, moreover, that an interdigitated transducer emits reciprocally-harmonic frequencies corresponding to occurrences in which the waves emitted by the active fingers are put back in phase. Thus, for a transducer comprising several cells similar to those illustrated in FIG. 2, the emitted frequencies correspond to the $\lambda$ wavelengths given by the formula:

$$k\lambda = 3P_E.$$

This is because the distance between two + electrodes is $3P_E$. Thus, it is found that at least two frequencies $F_1$ and $F_2$ are emitted, the wavelengths of which are given by:

$$\lambda_1 = 3P_E$$

$$\lambda_2 = 3P_E/2$$

As described above, in accordance with the invention, a spacing of $P_E = 2\lambda_0/3$ is chosen for the wavelength $\lambda_0$. The wavelengths $\lambda_0$ and $\lambda_2$ are thus identical. Under these conditions, therefore, the emitter cells will not only be in phase at the frequency $F_0$ corresponding to $\lambda_0$, but also at the frequency $F_0/2$ and, in addition, at all frequencies which are multiples of $F_0/2$. It may nevertheless be shown that the frequencies which are multiples of $3F_0/2$ are not coupled. The frequency $F_0/2$ in fact corresponds to a subharmonic, which presents practical difficulties. Indeed, if the piezoelectric material composing the substrate holding the combs is quartz, this subharmonic $F_0/2$ causes generation of a bulk wave at frequencies approaching $1.6.F_0/2$ and $1.8.F_0/2$ by virtue of a known physical phenomenon. Because these frequencies are very close to $F_0$, they produce interference lines which cause deterioration of filter rejection.

Figure 5:
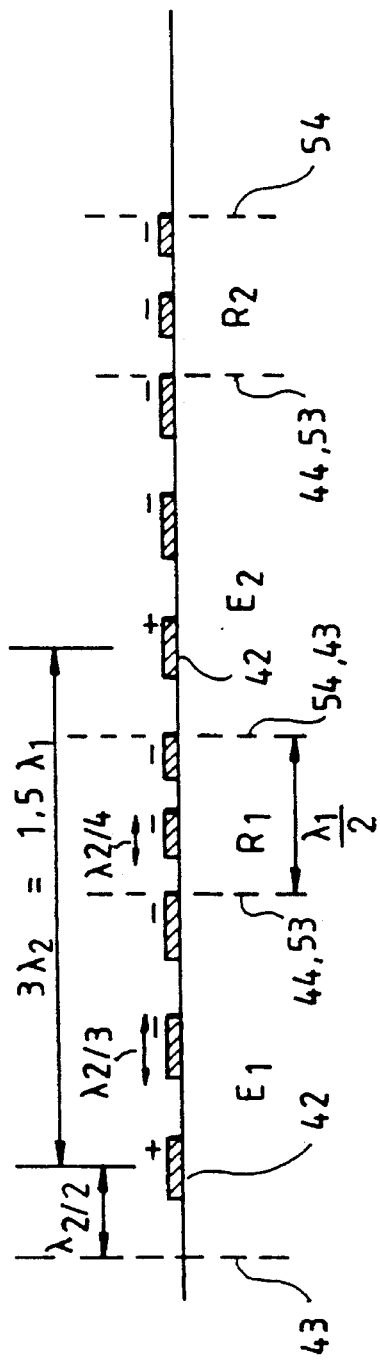
FIG. 5 is a view similar to that in FIG. 4, but which clarifies a number of explanations.

To ensure that frequencies at the wavelength $\lambda 1$, which may thus excite bulk waves, are not emitted, there must be no return to the in-phase configuration at that frequency from one emitter cell to the next. FIG. 5 illustrates two emitter cells $E_1$ and $E_2$ of the type previously described, which are separated by two reflector cells $R_1$ and $R_2$, also of the kind described above. The usable frequency to be emitted is $\lambda_2$, and the interference frequency to be avoided is $\lambda_1$. To eliminate this interference frequency, the centers of phase of the emitter fingers 42 of the two cells $E_1$ and $E_2$ must be separated by a distance equal to an odd number of repetitions of $\lambda_1/2$. As shown in the figure, this condition is fulfilled precisely in the case of emitter and reflector cells corresponding to FIGS. 2 and 3, which are used in the operating reflector shown in FIG. 4, since, in this case, this distance between the two centers of phase is equal to $3\lambda_2=1.5\lambda_1$. This condition can be applied generally by expressing it as a requirement, according to which the interval between successive emitter cells must be equal to $2(2m+1)/\lambda_2$; that is, to an odd multiple of two wavelengths at the frequency employed. In the case demonstrated, $m=0$, and the odd multiple is 1.

Figure 6:
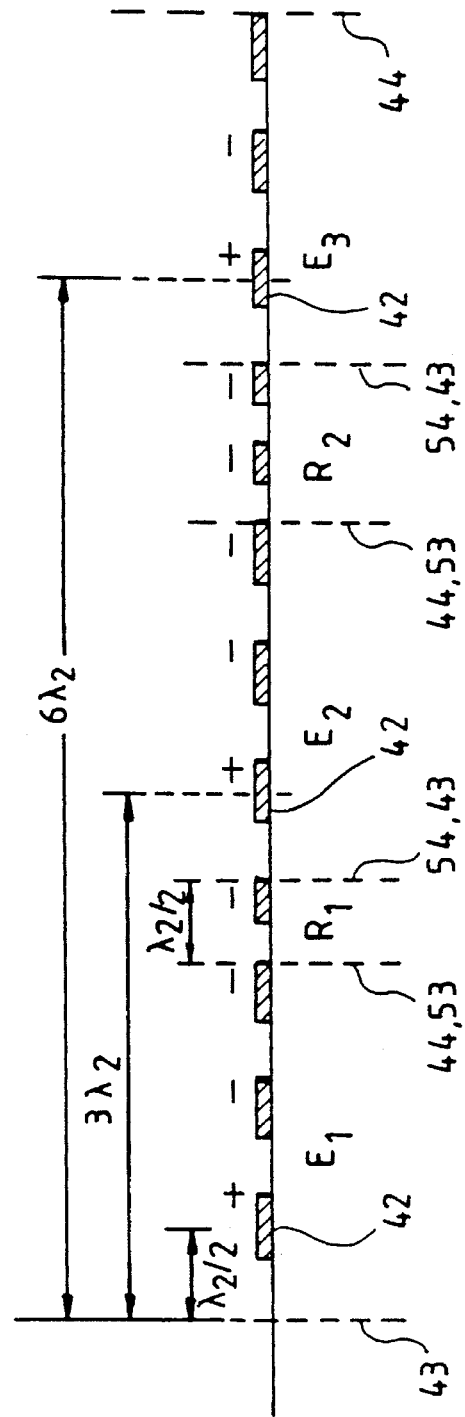
FIG. 6 is a cross-sectional view of a portion of a transducer according to one variant of the invention.
Figure 7:
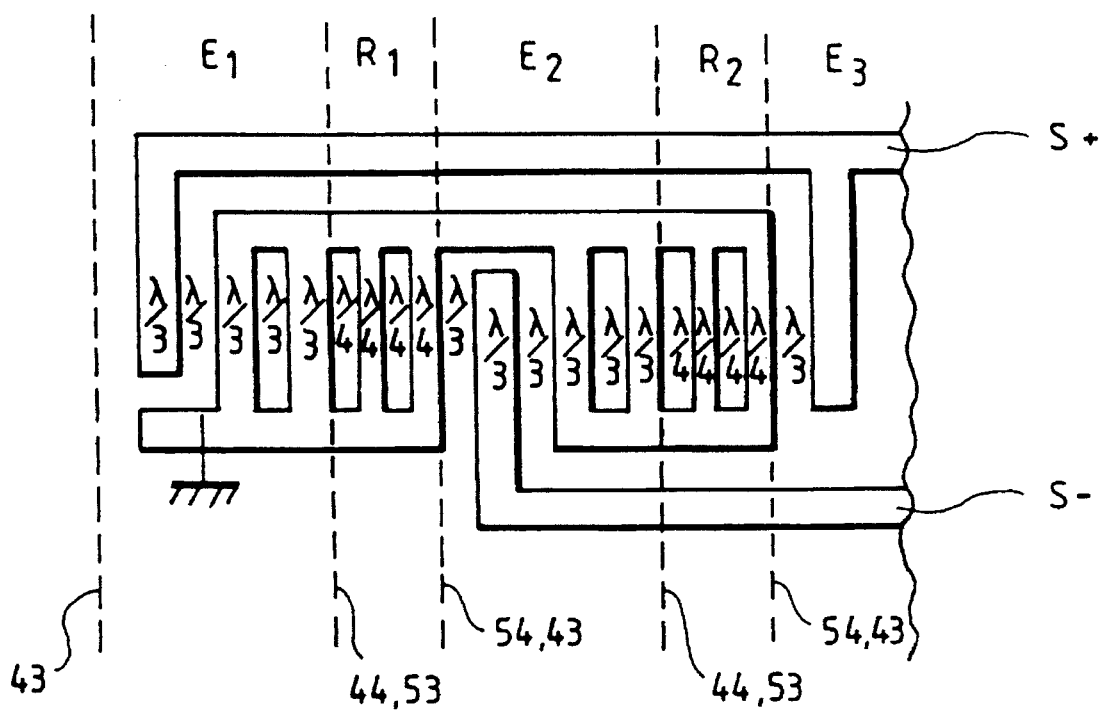
FIG. 7 is a partial top view of another variant of a transducer according to the invention.

In addition, as shown in FIG. 6, it is also possible to use some reflector cells having an uneven number of fingers, e.g., the cell $R_1$ having a single finger. Accordingly, the waves emitted, on the one hand, by the emitter cell $E_1$ and, on the other, by the emitter cells $E_2$ and $E_3$ will be in opposition of phase at the left boundary 43 of the emitter cell $E_1$ at the frequency corresponding to the usable wavelength $\lambda 2$. This makes it possible to obtain both positive and negative components by choosing this odd number of reflectors for a reflector cell, and, therefore, to obtain positive and negative weights when use is made of a method for weighting the emitter cells by source suppression. This method is known in English terminology as "withdrawal." Finally, use may be made a structure allowing a differential power feed between a + source and a − source, in relation to ground, as shown in FIG. 7. This structure comprises two emitter cells $E_1$ and $E_3$ connected to the + source, which enclose an emitter cell $E_2$ connected to the − source, these three cells being separated by the potentially-grounded reflector cells $R_1$ and $R_2$, these cells being, of course, placed at ground potential by symmetry.

This configuration allows the use of an intricately-patterned structure in which the grounded electrodes are interposed between those connected to the + source and those connected to the − source. In this way, enhanced protection is gained against electrostatic and pyroelectric interference.

All of the structures described above have the advantage that they can be produced using a single level of metallization and a single photoengraving operation. In comparison with conventional structures produced to date, in which photoengraving precision had to reach $\lambda/6$, the level of precision here is limited to $\lambda/4$ and $\lambda/3$, thereby making it possible, at the same level of photoengraving precision, to obtain a device that can operate at frequencies 50% higher than those normally used.

I claim:

1. Unidirectional ground wave transducer of the type comprising a line of emitter cells (E) and reflector cells (R) alternating in succession and arranged in such a way that the acoustic waves emitted by the emitter cells and reflected by the reflector cells are added together constructively in a direction of propagation and destructively in the other direction of propagation, wherein the emitter cells consist of two electrodes (41, 42) existing as interdigitated combs incorporating a spacing ($P_E$) equal to $2\lambda/3$, $\lambda$ being the operating midband wavelength of the transducer.

2. Transducer according to claim 1, wherein the electrode fingers in the emitter cells (41, 42) have a width approaching $\lambda/3$.

3. Transducer according to claim 2, wherein the electrodes (41, 42) of each active cell consist of at least one grouping of three fingers, including an active finger (42) followed by two inactive fingers (41).

4. Transducer according to claim 3, wherein the emitter cells are composed of a succession of units of three fingers consisting of one active finger followed by two inactive fingers.

5. Transducer according to any of claims 1 to 4, wherein the reflector cells (R) comprise fingers (51, 55) spaced apart by an interval of $\lambda/2$ and have a width approaching $\lambda/4$, the adjacent emitter cells being positioned in such a way that the center of the closest active finger is located at a distance of $$\frac{5\lambda}{8} + k\frac{\lambda}{2}$$

from the centers of the reflectors on one side, and $$\frac{15\lambda}{8} + k\frac{\lambda}{2}$$

on the other side.

6. Transducer according to claim 5, wherein most of the emitter cells are separated by an odd number of wavelengths.

7. Transducer according to claim 6, wherein at least one of the reflector cells ($R_1$) comprises an odd number of fingers making it possible to produce sources having opposite signs.

8. Transducer according to any of claims 1 to 7, wherein, from one emitter cell to the next, the active electrodes are connected in succession to a positive source (S+), then to a negative source (S−), these active electrodes being separated by an odd number of half-wavelengths, and the inactive electrodes in the emitter cells, as well as the fingers belonging to the reflector cells ($R_1$, $R_2$) are connected and potentially grounded, by using an intricately-patterned configuration making it possible to isolate electrostatically and pyroelectrically the electrodes connected to the positive source from the electrodes connected to the negative source.

* * * * *

UNITED STATES PATENT AND TRADEMARK OFFICE
CERTIFICATE OF CORRECTION

PATENT NO. : 5,550,793
DATED : August 27, 1996
INVENTOR(S) : Pierre DUFILIE

It is certified that error appears in the above-indentified patent and that said Letters Patent is hereby corrected as shown below:

On the title page, Items [22], [86], and [87], the PCT information, should read:

--[22]  PCT Filed: Sep. 6, 1993

[86]  PCT No.: PCT/FR93/00850
        §371 Date: Apr. 26, 1995
        §102(e) Date: Apr. 26, 1995

[87]  PCT Pub. No.: WO94/07307
        PCT Pub. Date: Mar. 31, 1994--

Also, Item [30], the Foreign Application Priority Data, should read:

--[30]  Foreign Application Priority Data

Sep. 15, 1992  [FR]  France.....92 10966--

Signed and Sealed this

Nineteenth Day of November, 1996

Attest:

BRUCE LEHMAN

*Attesting Officer*         *Commissioner of Patents and Trademarks*